(12) United States Patent
Suzuki et al.

(10) Patent No.: US 8,880,135 B2
(45) Date of Patent: Nov. 4, 2014

(54) LOW ALTERNATING-CURRENT LOSS OXIDE SUPERCONDUCTOR AND FABRICATING METHOD THEREOF

(75) Inventors: Kenji Suzuki, Tokyo (JP); Saburo Hoshi, Tokyo (JP); Junko Matsuda, Tokyo (JP); Teruo Izumi, Tokyo (JP); Yuh Shiohara, Tokyo (JP); Masataka Iwakuma, Fukuoka-ken (JP)

(73) Assignees: Railway Technical Research Institute, Tokyo (JP); International Superconductivity Technology Center, the Juridical Foundation, Tokyo (JP); Kyushu University, National University Corporation, Fukuoka (JP)

( * ) Notice: Subject to any disclaimer, the term of this patent is extended or adjusted under 35 U.S.C. 154(b) by 1256 days.

(21) Appl. No.: 11/560,522

(22) Filed: Nov. 16, 2006

(65) Prior Publication Data

US 2007/0145100 A1    Jun. 28, 2007

(30) Foreign Application Priority Data

Nov. 18, 2005 (JP) ................. 2005-334988

(51) Int. Cl.
  *H01L 39/14*  (2006.01)
  *H01B 12/06* (2006.01)
  *H01L 39/24* (2006.01)

(52) U.S. Cl.
  CPC .......... *H01L 39/143* (2013.01); *H01L 39/2467* (2013.01); *Y10S 505/887* (2013.01)
  USPC ........... 505/230; 505/231; 505/237; 505/887; 428/472; 174/125.1; 427/309

(58) Field of Classification Search
  CPC . H01L 39/143; H01L 39/2467; H01L 39/248; H01L 39/249; H01B 12/06

USPC .......... 505/231, 237, 238, 470, 887; 428/697, 428/701, 702, 698; 174/125.1; 29/599; 427/62, 309; 216/101
See application file for complete search history.

(56) References Cited

U.S. PATENT DOCUMENTS 6,270,908 B1 *   8/2001   Williams et al. .............. 428/469
6,537,689 B2 *   3/2003   Schoop et al. ................ 428/701
(Continued)

FOREIGN PATENT DOCUMENTS

IT   WO 2005/024963     *   3/2005   ............. H01L 39/24
IT   WO 2005024963 A1 *   3/2005   ............. H01L 39/14
(Continued)

OTHER PUBLICATIONS

Hix K et al., "Laser micromachining of coated YBa2Cu3O6+x superconducting thin films," E-Print COND-MATI0406311 [online] Jun. 14, 2004.*

(Continued)

*Primary Examiner* — Stanley Silverman
*Assistant Examiner* — Kallambella Vijayakumar
(74) *Attorney, Agent, or Firm* — Grossman, Tucker, Perreault & Pfleger, PLLC

(57) ABSTRACT

The present invention is configured such that, in a low AC loss oxide superconductor constituted by providing an oxide superconducting layer 6 on a substrate 1, said oxide superconducting layer 6 is separated into a plurality of filament conductors 2 in parallel to the lengthwise direction of said substrate 1 by dividing grooves 3 plurally formed in the widthwise direction of said substrate, and a high-resistance oxide 8 is formed in said dividing grooves 3. Because of the invention, it is possible to increase the insulation properties of individually divided mated filament conductors, and to obtain an oxide superconductor that has low AC loss.

7 Claims, 7 Drawing Sheets

(56) References Cited

U.S. PATENT DOCUMENTS

| | | | |
|---|---|---|---|
| 6,925,316 B2* | 8/2005 | Rey | 505/211 |
| 7,453,340 B2 | 11/2008 | Funaki et al. | |
| 7,593,758 B2* | 9/2009 | Foltyn et al. | 505/231 |
| 2007/0235210 A1 | 10/2007 | Baldini et al. | |

FOREIGN PATENT DOCUMENTS

| | | | | |
|---|---|---|---|---|
| JP | WO 2005/008687 | * | 1/2005 | H01B 12/06 |
| JP | 2005-085612 | | 3/2005 | |
| WO | 2005/008687 | | 1/2005 | |
| WO | 2005024963 A | | 3/2005 | |

OTHER PUBLICATIONS

Oberly C E et al., "The Importance of Interfilamentary Barrier Resistance in YBCO coated conductor to minimize ac losses," Joint Cryogenic Engineering Conference and International Cryogenic Materials Conference, Jul. 16-20, 2001, Madison, WI; AIP Conference Proceedings, No. 614B, 2002 (pp. 621-630).

Amemiya N et al., "AC Loss characteristics of multifilamentary YBCO coated conductors," IEEE Transactions on Applied Superconductivity, vol. 15, No. 2, Jun. 2005 (pp. 1637-1642).

European Search Report issued in European Patent Application No. 06124246.7-2222 on Jun. 9, 2008 (9 pages).

Hix K et al., "Laser micromachining of coated $YBa_2Cu_3O_{6+x}$ superconducting thin films," E-Print COND-MAT/0406311 [online] Jun. 14, 2004; retrieved from Internet: http://arix.org/abs/cond-mat/0406311 retrieved on May 20, 2008.

Levin G et al., "Multifilament $YBa_2Cu_3O_{6+x}$-coated conductors with minimized coupling losses," Applied Physics Letters, vol. 89, No. 1, Jul. 3, 2006 (pp. 012506/1-012506/3).

Suzuki K et al., "Development of a laser scribed process of coated conductors for the reduction of AC losses," Superconductor Science & Technology, vol. 20, No. 8, Aug. 2007 (pp. 822-826).

J. Yoo, J. Ko, H. Kim and H. Chung, "Fabrication of Twisted Multifilamentary BSCCO2223 Tapes by Using High Resistance Sheath for AC Application," IEEE Transactions on Applied Superconductivity, 9(2): 2163-2166 (Jun. 1999).

Office Action from corresponding Japanese Application No. 2005-334988 dated Mar. 15, 2011. English translation attached.

* cited by examiner

DIRECTION OF CONDUCTOR MOVEMENT

DIRECTION OF CONDUCTOR MOVEMENT

LOW ALTERNATING-CURRENT LOSS OXIDE SUPERCONDUCTOR AND FABRICATING METHOD THEREOF

BACKGROUND OF THE INVENTION

1. Field of the Invention

The present invention relates to an oxide superconductor with a structure contrived to mitigate loss during AC (Alternating Current) applications and fabricating method thereof. In particular, it relates to an improvement of technology to mitigate the AC loss with respect to a type of the oxide superconductor, which has an oxide superconducting layer on a base material, by employing a structure that plurally divides the oxide superconducting layer.

Priority is claimed on Japanese Patent Application No. 2005-334988, filed on Nov. 18, 2005, the content of which is incorporated herein by reference.

2. Description of the Related Art

Superconducting wires are used for DC applications and AC applications. In cases where superconducting wires are used in AC applied equipments such as armature coils of motors and transformers, since superconductors called Type 2 Superconductors are used, entry of magnetic flux into the superconductor is partially allowed, accordingly AC loss inevitably occurs. As a technology for mitigating the AC loss, in the metallic superconducting wire rod or compound oxide superconducting wire, which have been practically applied, the superconducting wire is downsized and formed into a tiny superconducting filament with multifilamentary structure in an extrusion process, drawing process, or rolling process, as well as locating a high-resistance barrier layer or the like between superconducting filaments, when creating the multifilamentary structure, to make the resistance between the superconducting filaments higher. (See: J. Yoo, J. Ko, H. Kim and H. Chung, "Fabrication of Twisted Multifilamentary BSCC02223 Tapes by Using High Resistance Sheath for AC Application," IEEE Transactions on Applied Superconductivity, 9(2): 2163-2166 (June 1999))

Instead of the metallic or compound superconductors that have been used, research and development on the oxide superconductors with a higher critical temperature has been progressed. As a part of this development, with respect to the oxide superconductor which has the oxide superconducting layer on the base material, the present inventors are pursuing with development of wire used for AC uses such as motors, transformers or the like.

Conventional metallic oxide superconductors allow metal processing and have allowed for multifilamenting by deformation processing. However, since the oxide superconductors are a type of ceramic and are extremely brittle, deformation processing is not applicable; accordingly it is necessary to downsize with a completely different technique.

Conventionally, as an example of a technique to downsize the oxide superconductor which has the oxide superconducting layer on the base material, as shown in FIG. 9, by forming an oxide superconducting layer 101 into plurally divided superconducting layers 103 by irradiating a laser beam on the oxide superconducting layer 101 formed on a tape-shaped base material 100 from its top face in the lengthwise direction, and forming a plurality of dividing grooves 102, which are made in lengthwise direction on the oxide superconducting layer 101, in the widthwise direction on the oxide superconducting layer 101.

For example, it is known that when the superconductor is divided in two pieces in the widthwise direction, the travel amount of the magnetic flux entering into the superconductor is reduced, thereby AC loss is mitigated.

For example, as an approximation formula of AC loss, the following formula (1) is known.

$$W(\text{AC loss}) = (\alpha/\gamma) \times B_m^\gamma \times (w/n) \qquad (1)$$

In this approximation formula, $\alpha$ and $\gamma$ are pin parameters, $Jc=\alpha B^{\gamma-1}$ (Irie-Yamafuji model), $\alpha=1.644\times10^9$, $\gamma=0.57$, $B_m$ is magnetic field amplitude, and is assumed to be in a range sufficiently larger than the equivalent center magnetic field range. Also, n shows the number of divisions of the superconductor.

That is, from the approximation formula, the value of W (AC loss) is related to the number of divisions of the superconductor. For example, it is said that when the number of divisions of the superconductor is set to 2, AC loss is ½, and when the number of divisions of the superconductor is set to 4, AC loss is ¼.

From this background, the inventors formed the oxide superconducting layer 101 as shown in FIG. 9 on the base material 100, and separated into two of divided superconducting layers 103, and then conducted tests to investigate effects of the divided structure by measuring the resistance value of the oxide superconductor which has the divided structure.

FIG. 10 shows test results for the case where the oxide superconducting layer, which is not divided, is formed on the base material and four measurement terminals (T1, T2, T3 and T4) are attached at fixed intervals on the surface in the widthwise direction, and resistance measurement is conducted by the DC four probe method. Of the four terminals, two outside terminals T1 and T4 correspond to the terminals for DC measurement, and the two inside terminals T2 and T3 correspond to the terminals for voltage measurement.

The horizontal axis of the graph of FIG. 10 shows temperature when the oxide superconducting layer of the aforementioned structure is cooled, and the vertical axis of which shows resistance values. It is clear that resistance values abruptly decline in the 80 K to 90 K temperature range, and that a transition occurs to a superconducting state. In less than 80 K temperature range, the plot of resistance values randomly fluctuates, showing a state that noise is detected after transition to a superconducting state has occurred.

FIG. 11 shows a measurement result of temperature dependency of resistance values for a sample where, with respect to the oxide superconducting layer 101, one dividing groove 102 is formed by laser in the lengthwise direction of the oxide superconducting layer 101 in the area between terminals T2 and T3, dividing the oxide superconducting layer 101 into two pieces.

In order to divide by laser, as shown in FIG. 12, a method was used where laser is irradiated from an approximately right angle (in the normal direction) from the top face of the oxide superconductor 105, and the oxide superconductor is moved in the lengthwise direction after setting a laser power so that the laser penetrates the oxide superconducting layer and reaches to the base material (see the arrow indicating the conductor movement direction).

As shown in the measurement result of FIG. 11, as the temperature of the oxide superconducting layer 101 divided into two pieces by the one dividing groove 102 is lowered, the resistance values drop by one step in the 80 K and 90 K temperature range compared to the higher temperature range, but resistance values in the same order as the resistance values prior to the drop are observed even after the resistance values have dropped. That is, approximately constant resistance values are observed in the 60 K to 80 K temperature range, which are low resistance values, but not a state that noise of resistance values is detected as shown in FIG. 10.

The inventors estimate that this is due to the following reasons.

As shown in FIG. 12, a laser beam 106 is irradiated vertically downward against the oxide superconductor 105 that is horizontally disposed, and the oxide superconducting layer of the oxide superconductor 105 is divided, and an enlarged view of the sectional observation by EPMA of the resultant oxide superconductor 105 is shown in FIG. 13.

As shown in FIG. 13, in the portion where the oxide superconducting layer is fusion cut by the laser, a molten coagulation part that projects toward the base material surface side could be confirmed. FIG. 13 shows a longitudinal cross-section which is parallel to the lengthwise direction of the base material, and the white part of FIG. 13 shows the base material. The oxide superconducting layer exists both to the left and right of the molten coagulation part which projects upward from the white part but the oxide superconducting layer is concealed in the black background part in FIG. 13, and the molten coagulation part is formed and projects along the portion which is fusion cut by the laser. It is estimated that, in the case where the oxide superconducting layer is irradiated by laser in order to fusion cut the superconducting layer as shown in FIG. 12, since the oxide superconducting layer has a thickness of 1 μm and the base material has a thickness of 100 μm, the laser reliably fusion cut a part of the base material, the portion of the base material melted by the laser becomes dross and is retained inside the dividing groove without being removed. As this molten coagulation is formed to become a projecting structure, the structure becomes such that both the left and right sides of supposedly divided oxide superconducting layer are bridged by this molten coagulation, and this part becomes an electric current pass, and thereby becomes the source of the occurrence of the low resistance values.

For example, in a case where an oxide superconductor, which has a structure that laminates a lower intermediate layer composed of $Gd_2Zr_2O_7$ (abbreviation: GZO), an upper intermediate layer composed of $CeO_2$, and the oxide superconducting layer composed of $Y_1Ba_2Cu_3Ox$ (abbreviation: YBCO) on a substrate of HASTELLOY (product name of Haynes International, Inc.) of Ni alloy, is used, when the projecting structure of the molten coagulation is formed as shown in FIG. 13, since the projecting structure contains a large amount of Ni, a circuit configuration like the equivalent circuit shown in FIG. 14 is made between terminals T2 and T3 such that the resistance of the molten coagulation whose main component is Ni is inserted in parallel into the resistance serial circuit loop, which is made of YBCO—$CeO_2$—GZO-HASTELLOY substrate-GZO—$CeO_2$—YBCO. Accordingly, it is estimated that the resistance of the molten coagulation, which has Ni as its primary component, is the cause of occurrence of the resistance values which is shown in FIG. 11.

Consequently, there has been a problem that it is not possible to fabricate the oxide superconductor which has low AC loss if the oxide superconducting layer is intended to be scribed by laser.

Instead of laser scribing, it is also conceivable that dividing groove is physically made by a cutter to divide the oxide superconducting layer to make the filament conductors. However, there is a problem in cutting accuracy by using the cutter, and there is a problem that it is not easy to cut only the oxide superconducting layer without cutting the base material, nor to form dividing grooves of uniform width in parallel to the entire length of an elongated oxide superconductor to divide into filament conductors with high transverse resistance values. Moreover, since cutting by a cutter accompanies physical load, there is a risk of providing physical damage to the base material and the oxide superconducting layer, which may deteriorate superconductivity.

The present invention was made in light of the foregoing circumstances, and its purpose is to offer a structure capable of enhancing the insulation properties of mated individual filament conductors that have been divided and of having the oxide superconductor with low AC loss, even when a structure, which divides the oxide superconducting layer into a plurality of filament conductors by irradiating laser against the oxide superconductor having a structure which disposes the oxide superconducting layer on the base material, is employed.

SUMMARY OF THE INVENTION

The present invention was made in light of the foregoing circumstances, and is configured such that, in the oxide superconductor having the oxide superconducting layer on a base material, said oxide superconducting layer is separated into a plurality of filament conductors in parallel to the lengthwise direction of said base material by dividing grooves which are plurally formed in the widthwise direction of said base material, and high-resistance oxide is formed in said dividing grooves.

By dividing the oxide superconducting layer into a plurality of filament conductors, the projection width of the applied magnetic field direction is reduced, and loss at the time of AC application is reduced. This derives from the fact that, when magnetic flux penetrates to the interior of the superconducting layer and when the magnetic flux starts to move at the time of AC application, the travel amount of the magnetic flux within the oxide superconducting layer is smaller than in a case where such a structure that the oxide superconducting layer is not divided is employed.

The present invention is constituted by electrically separating adjacent filament conductors via said dividing grooves, in which a high-resistance oxide is formed, or in other word, by realizing low AC loss by increasing resistance between filaments.

According to the present invention, as the oxide superconducting layer is divided into a plurality of filament conductors by the dividing grooves, it is possible to effect mitigation of AC loss. Moreover, as high-resistance oxide exists in the dividing grooves, even when mating filament conductors that are divided via the dividing grooves are bridged via the high-resistance oxide, the resistance values between adjacent mating filament conductors increase, the electrical connectivity of mating filament conductors at the time of AC application in superconducting state can be suppressed, low AC loss can be realized as a whole oxide superconductor.

In the present invention, said base material is constituted by having an intermediate layer for crystal orientation control or diffusion prevention formed on a metallic substrate.

In the present invention, said dividing grooves are formed to a depth that reaches said substrate or said intermediate layer.

By having the dividing grooves penetrate the oxide superconducting layer and reach the substrate, the oxide superconducting layer is reliably divided into the filament conductors, and the possibility of short circuit between the mating parts constituting filament conductors is eliminated, the oxide superconducting layer is plurally divided reliably, mitigation of AC loss is reliably realized.

In the present invention, said dividing grooves are formed by laser scribing, which fusion cuts the oxide superconducting layer by irradiating laser against the top face of the oxide superconducting layer on said base material.

As the oxide superconducting layer can be divided to an arbitrary width by fusion cutting, which divides the oxide superconducting layer by laser scribing, it is possible to plurally divide the oxide superconducting layer reliably, and to create downsized filament conductors, thereby contributing to mitigation of AC loss.

In the present invention, said high-resistance oxide is an oxide of molten coagulation which adheres to the inside of said dividing grooves during fusion cutting by said laser scribing.

According to the laser scribing, as the oxide superconducting layer can be reliably fusion cut at an arbitrary position, filament conductors can be reliably and easily produced, and by making the molten coagulation part that is inevitably produced during laser scribing oxide, a higher resistance of the molten coagulation is reliably achieved, and mitigation of AC loss is reliably achieved too.

In the present invention, said high-resistance oxide contains NiO.

In the present invention, the oxide superconductor is formed by providing the oxide superconducting layer formed on the base material and a stabilizing layer composed of conductive metallic material formed on the oxide superconducting layer, and said dividing grooves are formed so as to reach from said stabilizing layer to said base material.

In the present invention, the oxide superconductor is formed from a base material having a substrate made of heat resistant Ni alloy, a lower intermediate layer of $Gd_2Zr_2O_7$ formed on the substrate, and an upper intermediate layer of $CeO_2$, a superconducting layer of rare-earth oxide formed on said upper intermediate layer, and a stabilizing layer of conductive metal material formed on the superconducting layer, and said dividing grooves are formed so as to reach from said stabilizing layer to said base material.

With respect to the oxide superconductors with these specific structures, it is possible to provide a structure capable of mitigating loss during AC application. Moreover, it is possible to demonstrate excellent superconductivity with a structure provided with this lower intermediate layer and the upper intermediate layer, and the oxide superconducting layer formed thereon.

In the present invention, with respect to the oxide superconductor constituted by having the oxide superconducting layer on a base material or by having the oxide superconducting layer and the stabilizing layer on the base material, the surface of said oxide superconductor is diagonally irradiated by laser in the lengthwise direction of said base material, dividing grooves that plurally divide said oxide superconducting layer in the widthwise direction are formed so as to reach said base material, and the molten coagulation adhering to the inner sides of said dividing grooves are heated, oxidized, and imparted with high resistance.

By irradiating laser from diagonal direction of the oxide superconducting layer, it is easy to discharge the molten material of the oxide superconducting layer and the base material from the dividing grooves to outside. For example, when laser is irradiated toward the oxide superconducting layer from diagonal direction, the kinetic energy of the laser reflects opposite side from the direction of incidence of the laser with regard to the oxide superconducting layer, the kinetic energy of the laser collide against the oxide superconducting layer, and can displace or blow away the molten material to the direction of the reflection, thereby enable to reduce the residual portion of molten coagulation inside the dividing grooves.

In the present invention, said oxide superconducting layer is irradiated by said laser, purge gas is blown against said laser irradiated part, and the molten material due to the laser irradiation is partially blown away by said purge gas as well as said dividing grooves are formed, thereby dividing said oxide superconducting layer.

By irradiating laser from the diagonal direction of the oxide superconducting layer, and by blowing purge gas against the laser irradiated part, it is possible to reliably blow away and discharge the molten material of the oxide superconducting layer and the base material to outside. Because of this, the residual portion of the molten coagulation inside the dividing grooves can be largely reduced. For example, in the case where laser is irradiated and a reactive force of its kinetic energy is utilized to dispel the molten material from the dividing grooves to outside but the process only effects weakly, the molten material can be effectively removed from the dividing grooves by adding an process which blows away the molten material by blowing purge gas.

In the present invention, as said oxide superconductor, a conductor which has the base material, an intermediate layer for crystal orientation control formed on the base material, the oxide superconducting layer formed on the intermediate layer, and the stabilizing layer composed of conductive metal material formed on the oxide superconducting layer is used, and said dividing grooves are formed so as to reach from said stabilizing layer to the top of said base material.

In the present invention, when the surface of said oxide superconductor is irradiated by laser from the diagonal direction, the irradiation angle is set to a 0° to 45° range from the normal direction of the surface of the superconductor.

By irradiating laser at this angle, molten material can be reliably removed from the dividing grooves.

In the present invention, heat treatment is performed in a 400° C. to 800° C. range when said molten coagulation is oxidized in an oxygen-rich atmosphere.

By performing heat treatment in the temperature range, the molten coagulation can be reliably oxidized and imparted with high resistance, and thermal oxidation can be performed in a range that does not injure the oxide superconducting layer. That is, when the oxide superconducting layer, which is constituting the filament conductors, is heated to a high temperature, its crystal structure is damaged, leading to deterioration in superconductivity, and it is therefore desirable to perform heat treatment to an extent that does not damage the crystal structure of the oxide superconducting layer and be able to oxidize the molten coagulation.

By implementing the structures and methods of the present invention, it is possible to obtain the oxide superconductor with good superconductivity and low loss during AC application.

DETAILED DESCRIPTION OF THE INVENTION

Embodiments of the present invention will be explained below, but the present invention is not limited by these embodiments.

Figure 1:
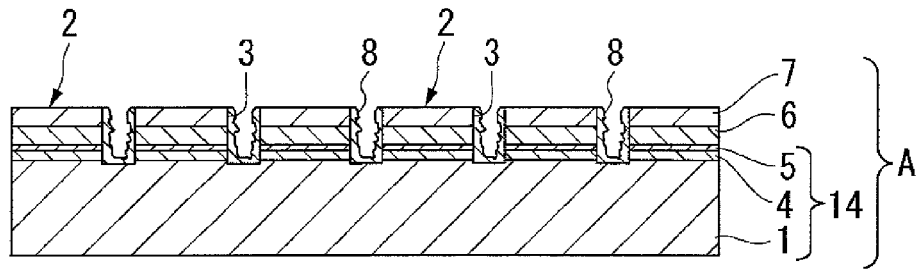
FIG. 1 is a sectional view showing a first embodiment of the oxide superconductor according to the present invention.
Figure 2:
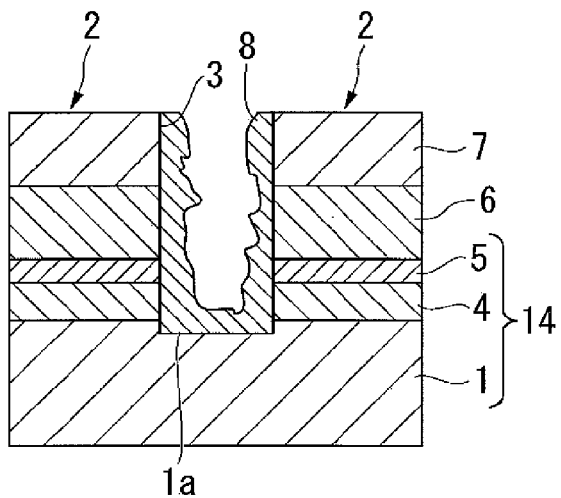
FIG. 2 is a partially enlarged sectional view of the oxide superconductor of FIG. 1.
Figure 3:
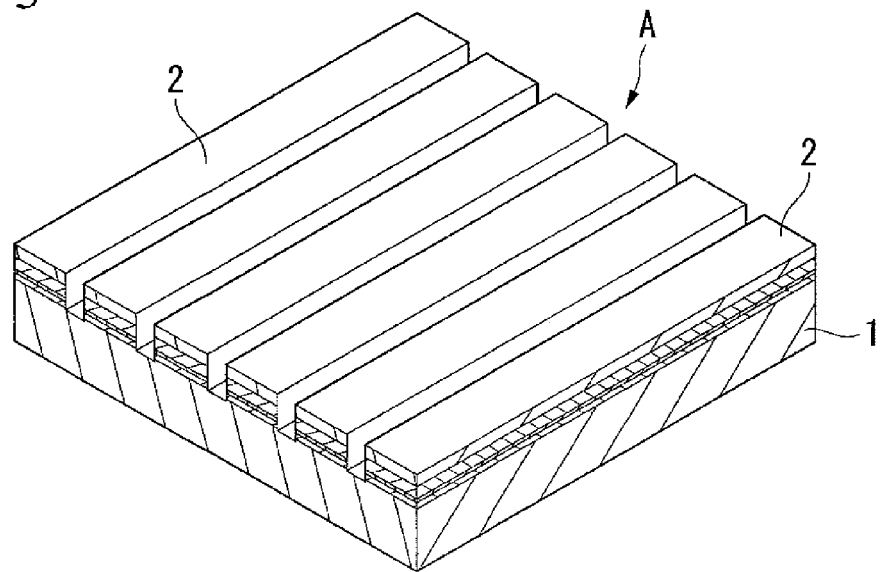
FIG. 3 is a partial perspective view of the oxide superconductor of FIG. 1.

FIG. 1 is a sectional view of the oxide superconductor of a first embodiment of the present invention, FIG. 2 is a partially enlarged sectional view of the same oxide superconductor, and FIG. 3 is a partial perspective view of the same oxide superconductor.

An oxide superconductor (A) according to the present embodiment comprises filament conductors 2, which have the same length as the substrate 1 and are narrower than the width of substrate 1 and are thinner than the substrate 1, which are plurally arranged at prescribed intervals on an elongate tape-like substrate 1 made of heat resistant metal material in parallel to the widthwise direction of the substrate 1. Dividing grooves 3, which divide the respective filament conductors 2, are formed between the respective filament conductors 2 across the entire length of the substrate 1.

In the present embodiment, the filament conductors 2 have a four-layered structure comprising a lower intermediate layer 4 for orientation control formed on the substrate 1, an upper intermediate layer 5 laminated on the substrate 1, an oxide superconducting layer 6 laminated on the upper intermediate layer 5, and a stabilizing layer 7 composed of metallic material with good conductivity such as Ag laminated on the oxide superconducting layer 6. In the structure of this embodiment, a laminated structure comprising the lower intermediate layer 4 for orientation control laminated on the substrate 1 and the upper intermediate layer 5 laminated on the lower intermediate layer 4 is called a base material 14.

The substrate 1 comprises metal material of heat resistant alloy, for example a HASTELLOY (product name of Haynes International, Inc.) of Ni alloy, or a Ni—W alloy or the like and is formed to have a thickness of 50 μm to 1 mm (For example: 100 μm). The aforementioned HASTELLOY is known as a heat resistant or corrosion resistant Ni based alloy, and there exists several types of them such as HASTELLOY B, C, X, G, or the like due to differences in added components such as Mo, Cr, Fe and Co. Since all kinds of the HASTELLOY have excellent heat resistance and corrosion resistance, they can be used as the substrate of the present invention. It is preferable that the substrate 1 is made from flexible material for the case in which a superconducting coil or a superconducting magnet is fabricated by winding the superconductor (A) onto a winding bobbin or the like.

The lower intermediate layer 4 for the orientation control is formed on the substrate 1 in order to mitigate the thermal expansion coefficient of the metallic material and ceramic material and to mitigate the differences in lattice constants of the crystal, and also in order to control the crystal orientation of the oxide superconducting layer 6 or the like since the substrate 1 is a metallic material while the oxide superconducting layer 6, which is made of ceramic, is disposed on the substrate 1. It is preferable that the lower intermediate layer 4 is formed with good crystal orientation on the substrate 1 of metallic material using a conventional film formation method such as the ion beam assisted deposition method. The lower intermediate layer 4 comprises a crystal structure close to the crystal structure of the oxide superconducting layer 6, and is a layer in order to function as a foundation layer for the case in which the oxide superconducting layer 6 is formed on the lower intermediate layer 4.

As the lower intermediate layer 4, a composition consisting of $Gd_2Zr_2O_7$ and a layer with a thickness of a fraction of 1 μm may be applied, but it is not limited thereto, other ceramic materials may also be used such as MgO.

As the upper intermediate layer 5 is a foundation layer of the oxide superconducting layer 6, which is formed on the upper intermediate layer 5 directly, and largely effects on the crystal orientation of the oxide superconducting layer 6, which is formed as a film, it is preferable that the upper intermediate layer 5 has an even better crystal orientation than that of the lower intermediate layer 4. As the upper intermediate layer 5, a layer made of $CeO_2$ with a thickness of a fraction of 1 μm may be cited, but it is not limited thereto. The structure, laminating the lower intermediate layer 4 made of $Gd_2Zr_2O_7$ on the HASTELLOY substrate and further laminating the upper intermediate layer 5 made of $CeO_2$ thereon to form a substrate 14 is known as a technology for obtaining a foundation layer of the oxide superconductor 6 which has an extremely high orientation. It is preferable to use the ion beam assisted deposition method to obtain such an orientation of the lower intermediate layer 4 that the degree of orientation of the crystal axis is 10° to 20°, because, it is possible to form a film on the lower intermediate layer 4 with high speed with such an excellent crystal orientation that the degree of orientation of the crystal axis is 10° or less, for example around 5°, as the crystal orientation of the upper intermediate layer 5, by using the pulsed laser vapor deposition method, and accordingly it is possible to obtain the oxide superconducting layer 6 on the upper intermediate layer 5 with high orientation and high critical current density.

In the present embodiment, the base material 14 comprising the combination of the lower intermediate layer 4 and the upper intermediate layer 5 is used, because it is possible to make the crystal orientation of the upper intermediate layer 5 made of $CeO_2$ to be particularly good as that of single crystal, by forming the upper intermediate layer 5 made of $CeO_2$ on the lower intermediate layer 4 made of $Gd_2Zr_2O_7$ as mentioned above. However, a desirable combination of intermediate layers is not limited to the combination of this example. But as is known to be laminated structures for crystal orientation control, laminated structures such as MgO layer and YSZ (yttrium-stabilized zirconia) and $CeO_2$, or $Y_2O_3$, YSZ, and $CeO_2$ may be used. Of course, other generally known foundation layers for orientation control as the oxide superconducting layer are able to be used as a base material formed in single layer or multiple layer structure.

The oxide superconducting layer 6 with a thickness of several μm is laminated on the upper intermediate layer 5. During film formation, the oxide superconducting layer 6 was made with epitaxial growth in conformity with the crystal orientation of the upper intermediate layer 5, therefore it is made so that its crystal orientation is good and excellent superconducting properties are obtained. The oxide superconducting layer 6 can be made of the oxide superconductors of well known compositions. For example, as $REBa_2Cu_3O_{7-X}$ series (RE comprises one or more rare-earth elements including Y) is known as a superconductor of rare-earth oxide series, components of this series may be used, of course, components made of other oxide superconductors such as Bi series or Tl series may be used. Taking application current or critical current density or the like into considerations when the oxide superconductors are used for AC uses, it is preferable to use components of $YBa_2Cu_3O_{7-X}$ series from the existing technology point of view.

The stabilizing layer 7 is formed in purpose of preventing normal-conducting transition by becoming a current pass when normal-conducting is about to begin in the oxide superconducting layer 6 during application or when incoming magnetic flux starts to move and is about to generate heat. It is therefore preferable that the stabilizing layer 7 is laminated so that a metallic material layer of good conductivity with low electrical resistance contacts the superconducting layer 6. From this viewpoint, it is preferable to use Ag or Ag alloy as the constituent material of the stabilizing layer 7. Furthermore, it is preferable that its thickness is several tens of μm.

The filament conductors 2 on the substrate 1 are formed such that adjacent filament conductors 2 are separated via the dividing grooves 3. The dividing grooves 3 penetrate the stabilizing layer 7, the oxide superconducting layer 6, the upper intermediate layer 5, and the lower intermediate layer 4, and are formed to a depth that reaches the upper part of the substrate 1 and that forms the concavity 1a on the upper part of the substrate 1 as shown in FIG. 2. In addition, on the inner side of the dividing grooves 3, a high-resistance oxide 8 of amorphous shape made of molten coagulation is formed so as to cover the bottom and inner side faces of the dividing grooves 3. The high-resistance oxide 8 is formed by oxidizing the molten material, which is coagulated, that is produced when the stabilizing layer 7, the oxide superconducting layer 6, the upper intermediate layer 5, the lower intermediate layer 4, and the upper part of the substrate 1 are fusion cut by the below-described laser irradiation.

As the high-resistance oxide 8 contains a large amount of Ni when the substrate is formed from HASTELLOY or Ni—W alloy, it is a molten coagulation oxide of alloy whose primary component is Ni. In addition, it also partially contains the elements which compose each of the stabilizing layer 7, the oxide superconducting layer 6, the upper intermediate layer 5, and the lower intermediate layer 4. Here, the substrate 1 has a thickness more than the order of 100 μm, the upper intermediate layer 5 and the lower intermediate layer 4 formed thereon have thicknesses of a fraction of 1 μm range, the oxide superconducting layer 6 has a thickness of several μm range, and the stabilizing layer 7 has a thickness of several μm range, when fusion cutting is performed by laser, the constituent material of the melted substrate 1 becomes the main component of the high-resistance oxide 8

Here, it is enough that the dividing grooves 3 completely divide the oxide superconducting layer 6, and it is not indispensable that they reach down to the substrate 1. However, when the oxide superconductor is fabricated by fusion cutting by laser as described below, it is difficult to accurately perform fusion cutting to the bottom face of the oxide superconducting layer 6 even with fine adjustment of laser output. If a portion of the oxide superconducting layer 6 were to remain at the bottom side of the dividing groove 3 due to inadequate fusion cutting, each of the adjacent oxide superconducting layers 6 easily connect electrically. Therefore, when performing laser fusion cutting, it is preferable to form the dividing groove 3 so that it reaches down to the substrate 1, it is therefore preferable that the dividing grooves 3 is formed to reach the substrate 1.

The oxide superconductor (A) according to the present embodiment is formed such that, the filament conductors 6, which have narrower width than that of the substrate 1, are plurally formed in the lengthwise direction of the substrate 1 in a mutually separated manner, and the high-resistance oxide 8 is formed in the dividing grooves 3 between adjacent filament conductors 6, insulation between adjacent filament conductors 2 existing across the dividing grooves 8 is high, and imparted with high resistance. Therefore, when the oxide superconductor (A) of the present embodiment is applied to AC use equipments such as motors and transformers, it is possible to suppress the AC loss which occurs during AC use because of the downsizing of the filament conductors 2. Furthermore, as the oxide superconductor (A) according to the present embodiment is divided into a plurality of filament conductors 2 by a plurality of dividing grooves 3, its primary effects are fully exhibited when divided by a number of divisions n in line with the previous Formula (1) W (AC loss)= $(\alpha/\gamma) \times B_m \gamma \times (w/n)$, and thereby AC loss is also mitigated.

Figure 4:
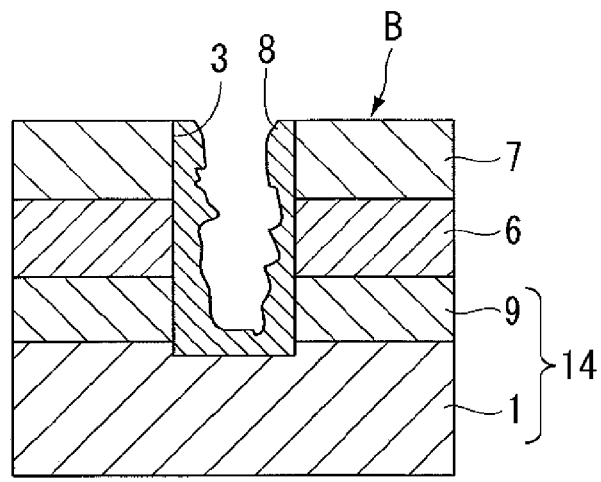
FIG. 4 is a sectional view showing a second embodiment of the oxide superconductor according to the present invention.

FIG. 4 shows an oxide superconductor (B) according to a second embodiment of the present invention. As in the case, such a structure may be used that the base material 14 is fabricated by forming a single layered intermediate layer 9 on the substrate 1, the oxide superconducting layer 6 is directly laminated thereon, and the stabilizing layer 7 is further laminated on the oxide superconducting layer 6.

When the intermediate layer 9 is made as single layered structure as described above, the intermediate layer 9 may be made of any one of $Gd_2Zr_2O_7$ layer, $CeO_2$ layer, MgO layer, or YSZ layer or the like as described above, but it is desirable to well control the crystal orientation even when whichever layer is used.

Next, one example of a method for fabricating the oxide superconductor (A) of the present embodiment will be explained.

Figure 5:
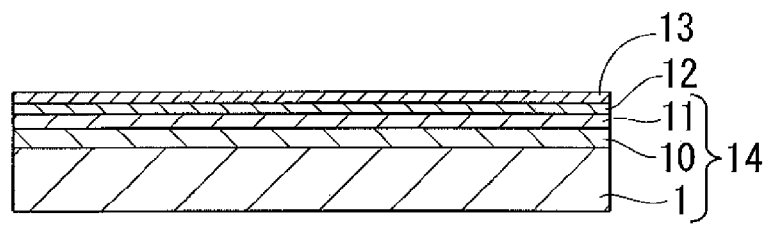
FIG. 5 is a sectional view explaining the method of the present invention, which shows a substrate is laminated by a lower intermediate layer, an upper intermediate layer, the oxide superconducting layer and the stabilizing layer.

To fabricate the oxide superconductor (A) of the aforementioned structure, first, a laminated body is configured by sequentially forming a lower intermediate layer 10, an upper intermediate layer 11, an oxide superconducting layer 12, and a stabilizing layer 13 on the substrate 1 as shown in FIG. 5.

To fabricate the lower intermediate layer 10, film is formed by using an orientation control film formation technique such as the ion beam assisted sputter deposition method or the like. Subsequently, the upper intermediate layer 11 and the oxide superconducting layer 12 are formed using a film formation method such as the pulsed laser vapor deposition method, and the stabilizing layer 13 is formed thereon by a method such as plating, sputter or the like. Once all the films are formed on the substrate 1, the dividing grooves are formed by irradiating a laser beam from diagonally above the stabilizing layer 13 which is the topmost layer of the films.

Figure 6:
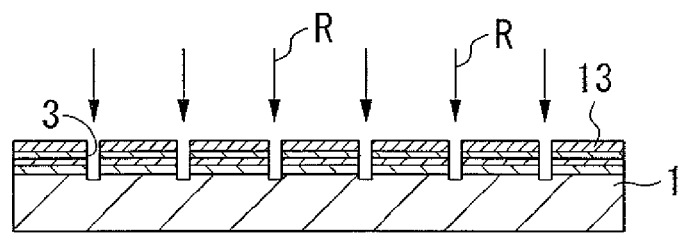
FIG. 6 is a front view showing dividing grooves are being formed by irradiating the oxide superconductor comprising the laminated structure of FIG. 5 with laser.
Figure 7:
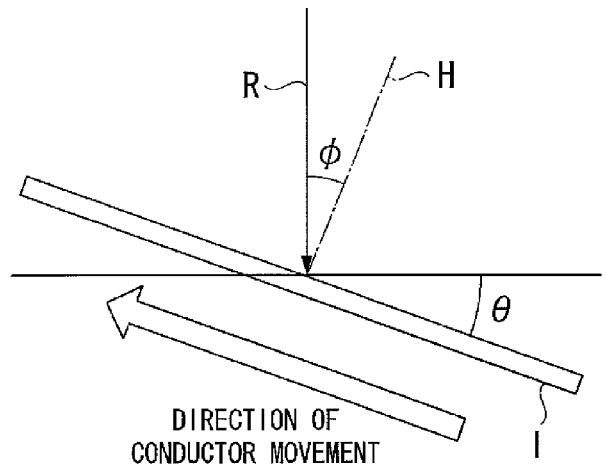
FIG. 7 is a side view showing dividing grooves are being formed by irradiating the oxide superconductor comprising the laminated structure of FIG. 5 with a laser.

FIG. 6 shows the front view when the laser beam is started to irradiate relative to the substrate 1, and FIG. 7 shows a mutual relationship between the substrate 1 and the laser beam irradiation direction.

As shown in FIG. 6 and FIG. 7, the laser beam is irradiated from above the substrate 1, and when the substrate 1 is viewed from side as shown in FIG. 7, the laser beam is irradiated to the substrate 1 from diagonally above with incidence angle φ relative to the normal line (H) of the substrate 1, and the substrate 1 is moved as it is inclined upwardly by angle θ relative to the horizontal face.

FIG. 7 shows the substrate 1 is moved slightly upwardly by angle θ, with the laser beam irradiation direction (R) indicated as vertically downward. Moreover, purge gas such as nitrogen gas is blown downward along the irradiation direction (R) to the vicinity of where laser was irradiated. The blowing speed of the purge gas may be set, for example, to 20 L/min. As purge gas, it is preferable to use an inert gas such as Ar gas or N2 gas.

Dividing grooves are formed in parallel to the lengthwise direction of the substrate 1 by blowing purge gas in conjunction with laser irradiation as shown in FIG. 7, and fabricated with a travel speed of the substrate 1 and a laser intensity such that the stabilizing layer 13, the oxide superconducting layer 12, the upper intermediate layer 11, and the lower intermediate layer 10 are penetrated, and the dividing groves are reached to the upper part of the substrate 1. By forming the dividing grooves along the entire length of the substrate 1, it is possible to divide the oxide superconducting layer 12 into a plurality of filament conductors.

It is possible to reliably divide the oxide superconducting layer 12 via the dividing grooves by adjusting laser intensity and travel speed of the oxide superconductor, and by fabricating so that the dividing grooves reliably reach to the upper part of the substrate 1. Here, as it is enough if the bottom part of the oxide superconducting layer 12 is reliably divided, it is not indispensable that the laser beam reaches to the substrate 1, but if even a slight portion of the bottom part of the oxide superconducting layer 12 remains, that portion bridges and weakens the effect of dividing the oxide superconducting layer 12 into a plurality of filament conductors 6, and therefore, the oxide superconducting layer 12 can be more reliably divided by making the laser beam reach the upper part of the substrate 1. During the process of forming the dividing grooves by a laser beam, the molten material (dross) can be removed as much as possible by a removal effect which inclines the oxide superconductor and make the molten material flow downward along the dividing groove, and by an effect of the kinetic energy of the laser beam which forces to initiate movement, and by an blowing effect which blows by blown purge gas. However, a small amount of molten material (dross) still remains in the dividing grooves.

This residual molten material becomes a molten coagulation, if it is remained, there is a risk that it bridges adjacent filament conductors to make them conducted via the molten coagulation in the diving grooves as it is a conductive material containing a large amount of Ni. Consequently, in this invention, the molten coagulation is oxidized by performing heat treatment in an oxidizing atmosphere after forming the dividing grooves by laser.

An oxidizing atmosphere means a room air or an oxygen gas atmosphere, and heat treatment is performed for the prescribed time period within the range of 400 to 800° C. of the atmosphere. As the molten coagulation whose primary component is Ni is oxidized into an oxide whose primary component is NiO by the heat treatment, high resistance is imparted. Specifically, for example, compared with a case where oxidation treatment is not conducted, a high resistance of more than 2 digits, for example 100 times or more, can be imparted. Because of this, even if molten coagulation remains inside the dividing grooves, the filament conductors resembles a structure where they are electrically divided during application of the superconducting current, accordingly AC loss can be mitigated. Moreover, by imparting high resistance to the molten coagulation, it is possible to fully demonstrate an effect of dividing the superconducting layer 12 into a plurality of filament conductors 2 and thereby mitigates loss during AC application. Here, the reason why the lower limit of heating temperature is set to 400° C. is that although pure Ni oxidizes even at room temperature, since the molten coagulation contains other elements, and furthermore, oxidation speed is insufficient with thermal oxidation in a low temperature range including room temperature, either a long time period is required for oxidation or there is risk of uneven oxidation. If oxidation is performed at a temperature lower than 400° C., there is a risk of insufficient oxidation even if heated over a long period of time. The reason why the upper limit of heating temperature is set to 800° C. is that when heating is performed over a long period of time at a temperature higher than this, there is a risk that the elements (elements such as YBaCuO) composing the oxide superconducting layer and the intermediate layer react at interface.

Incidentally, in the preceding embodiment, the method is employed in which laser beam is irradiated while the oxide superconductor is moved forward in a diagonally upward direction; this is preferable for the purpose of making the molten material move backwardly by an effect of gravity. However, it is not indispensable to make the oxide superconductor move as in this example, but the molten material is removed from the dividing grooves even if the substrate is horizontally set and the irradiation angle of the laser beam and the blowing angle of the purge gas are set diagonal. Moreover, although it is preferable that the direction of irradiation of the laser beam is set within a range of 0 to 45° relative to the normal line (H) of the substrate when viewed from the side of the oxide superconductor, it is not limited to this range. However, as a laser is normally used by narrowing the focus by the lens system, and as the spot diameter of an inclined laser beam becomes elliptical, considering the disadvantages such as the reduction in energy density and the disposition of focal distance, effects weakens when the range exceeds 45°.

Furthermore, it is desirable that the laser beam irradiates vertically downwardly when the substrate 1 is viewed from front as shown in FIG. 6, but laser beam may be inclined, when viewed from front, to such an extent as long as the dividing grooves are formed. With respect to the irradiation angle of laser beam, when viewed from front, it is preferable to set in reference to the aforementioned 0 to 45° angle of the case in which viewed from side.

Furthermore, with respect to the fabrication using laser, if such a configuration that a plurality of laser beams are irradiated at one time as shown in FIG. 6 is employed, it is possible to divide into a plurality of filament conductors by one movement of the laser beam in the lengthwise direction of the oxide superconductor, and thereby even an elongated oxide superconductor can be divided only by a single scan.

Next, in the foregoing embodiment, it is possible to demonstrate a dross reduction effect by increasing the laser spot diameter within a range of energy density in which the laser fully reaches to the substrate 1. However, it seems that there are limits in increasing the laser spot diameter, because increasing the laser spot diameter and expanding the laser irradiation width causes an increase in the width of fusion cutting of the oxide superconducting layer, and increases the area in which properties of the oxide superconducting layer are deteriorated in just proximal to the spot where laser beam is irradiated and so on. Moreover, when the laser spot diameter is made too small, even when the effect of blowing dross away is performed by moving the oxide superconductor diagonally upward and by irradiating the laser beam and blowing the purge gas as described above, it is possible that the dividing grooves suction and store dross as a result of capillarity phenomenon due to the reduction in size of the dividing grooves, thereby effectively reducing dross impossible.

Considering this background, it is considered desirable to set the laser spot diameter to a width of 20 μm or more, or 30 μm more. There are no particular restrictions in the upper limit of the laser spot diameter as long as the applied oxide superconductor is a wide-width object, but taking the number of divisions and the like into consideration, when the conductor has a width of several cm, 100 μm range is preferable.

EXAMPLES

Specific examples will be described below, but the present invention is not limited by these examples.

The base material was fabricated in such a way that a plurality of tape-like substrates made of HASTELLOY (product name of Haynes International, Inc.) which has 10 mm wide, 15 mm long, and approximately 100 μm thick were prepared, $Gd_2Zr_2O_7$ layer with 0.7 μm thick was formed on these substrates based on the conventional ion beam assisted sputter method, and $CeO_2$ layer with 0.3 μm thick was further laminated thereon by the pulsed laser vapor deposition method. When the orientation of the $CeO_2$ layer was investigated, it is confirmed that it is 5° or less in terms of the Δϕ value, which is an indicator of orientation, and it is therefore proved that a $CeO_2$ layer of very high orientation is formed.

Subsequently, the oxide superconductors are obtained in such a way that an oxide superconducting layers of 2.4 μm thick with a composition of $YBa_2Cu_3O_{7-X}$ are laminated by the pulse laser vapor deposition method on the $CeO_2$ layers of each substrate, and stabilizing layers made of Ag of 20 μm thick are further formed thereon by the plating or sputter method or the like.

These oxide superconductors were irradiated by a laser beam vertically downward, while the substrate was inclined upwardly by 25° or 35° relative to the moving direction of the oxide superconductor as shown in FIG. 7. And then, purge gas of argon gas was blown to the laser irradiated part at the same angle as the laser irradiation angle and with a blast speed of 20 L/min, and one dividing groove with a width of approximately 20 μm, which reaches to the substrate, is formed while moving the oxide superconductor at a speed of 6 mm/sec, thereby dividing the oxide superconducting layer into two filament conductors. The laser device was set to a laser frequency of 10 kHz, laser energy of 4 W, and laser spot diameter of 30 μm.

After dividing by laser, annealing treatment was performed, in which each oxide superconductor was heated at 700° C. for 10 hours in an oxygen atmosphere, and the oxidation treatment was performed to the molten coagulation supposed to be remained inside the dividing grooves.

Figure 8:
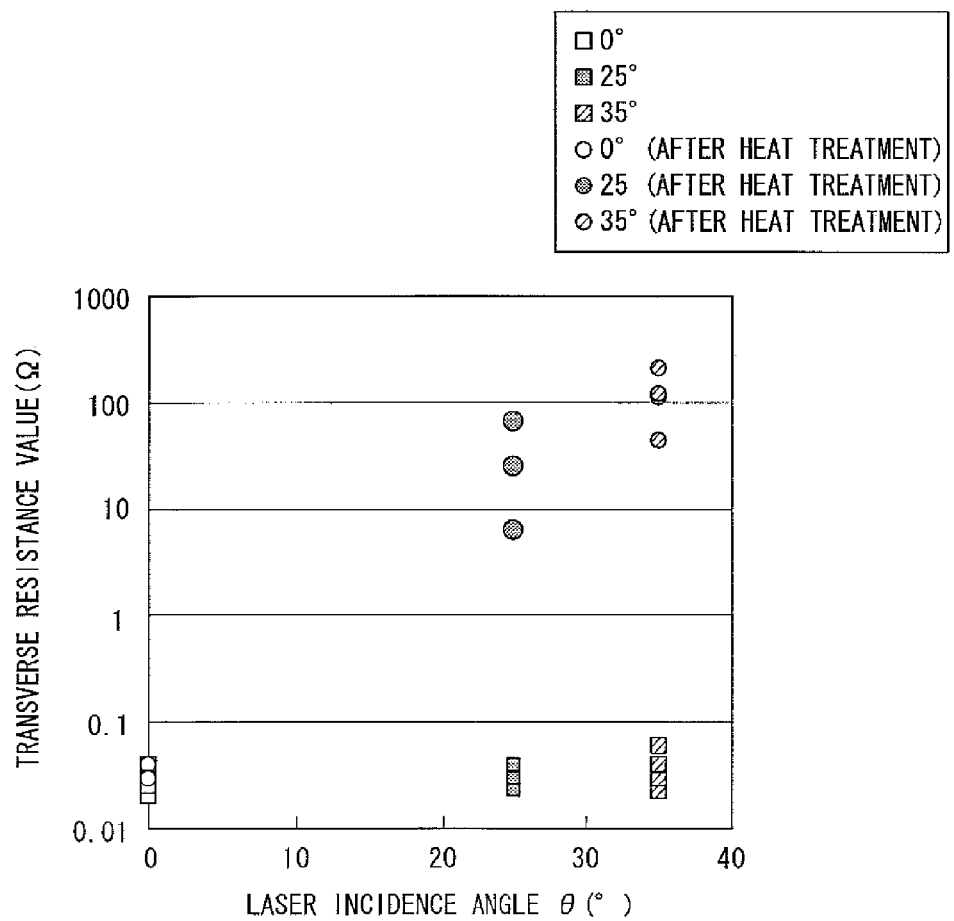
FIG. 8 is a graph showing a measurement result with regard to the changes in transverse resistance values before heat treatment and after heat treatment against a structure obtained in the examples.
Figure 9:
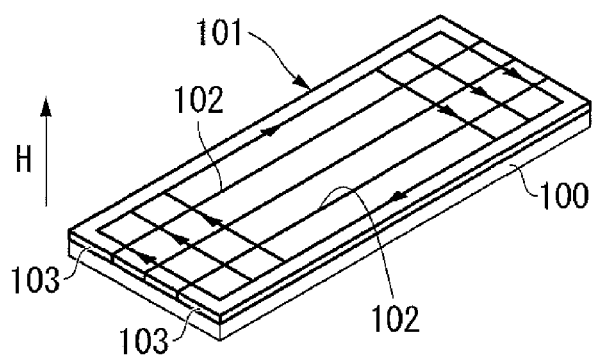
FIG. 9 is a perspective view showing dividing grooves are formed to divide the oxide superconducting layer on a conventional oxide superconductor.
Figure 10:
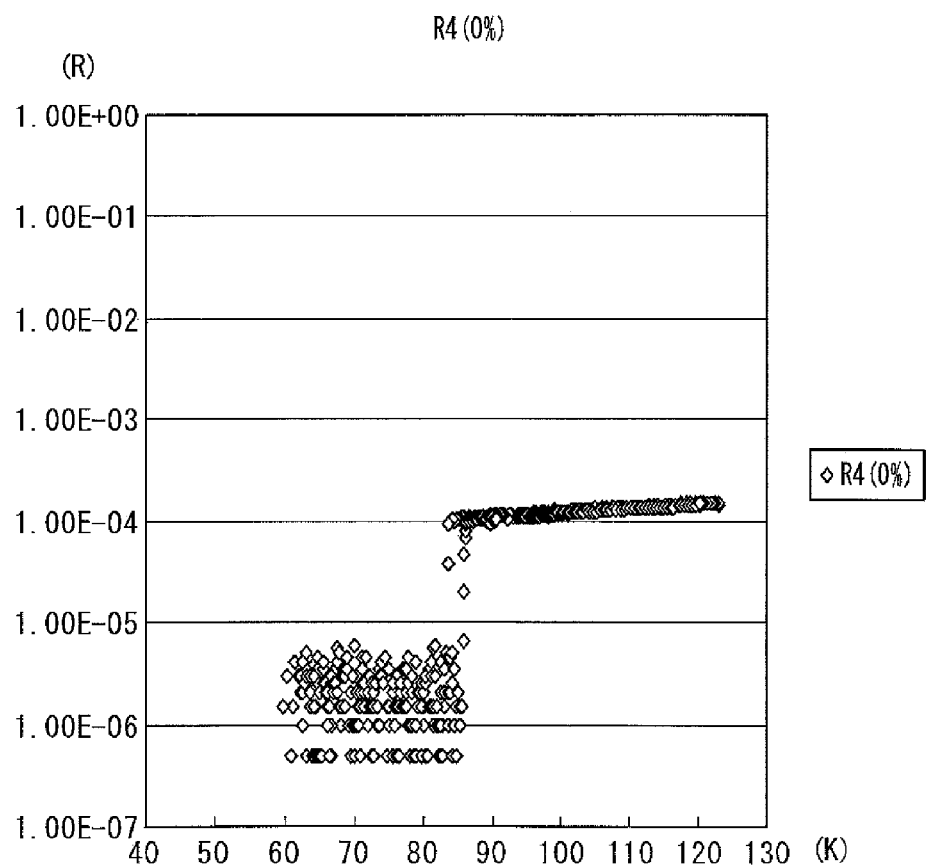
FIG. 10 is a figure showing a measurement result of transverse resistance values in the conventional oxide superconductor in which dividing grooves have not been formed.
Figure 10:
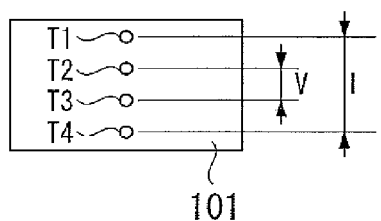
Figure 11:
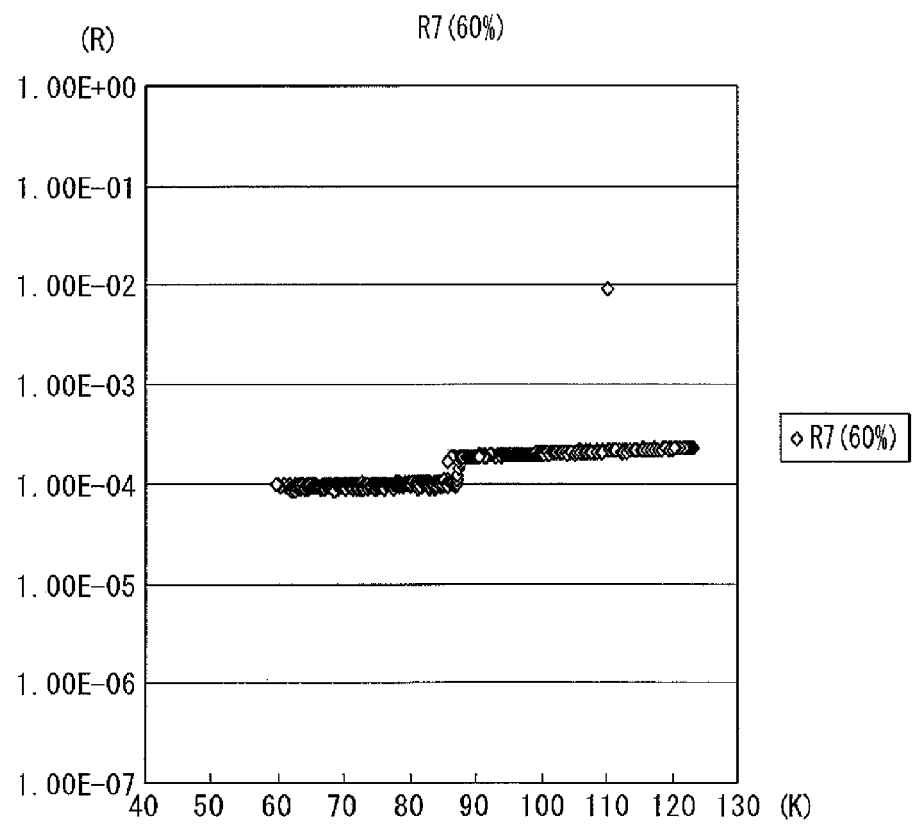
FIG. 11 is a figure showing a measurement result of transverse resistance values in the conventional oxide superconductor in which dividing grooves have been formed.
Figure 11:
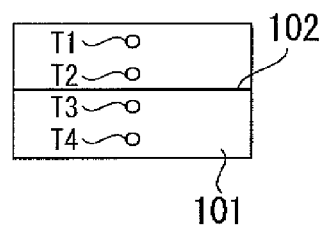
Figure 12:
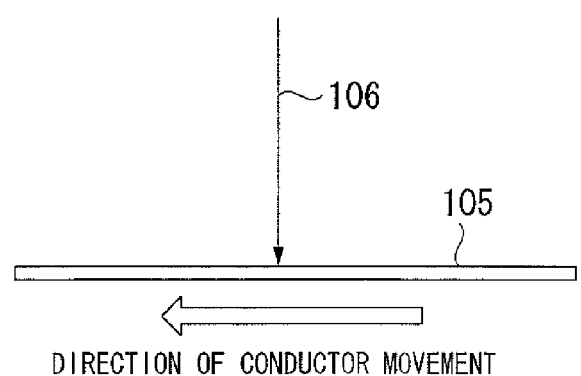
FIG. 12 is a figure showing one example of forming dividing grooves in the conventional oxide superconductor by irradiating laser.
Figure 13:
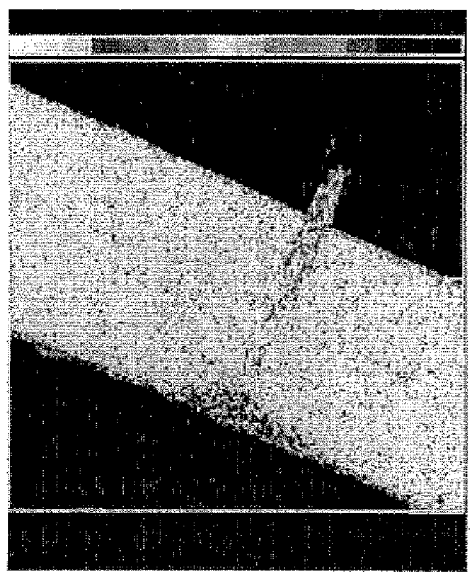
FIG. 13 is a figure showing a sectional photo of one example of an oxide superconductor obtained by the method shown in FIG. 12.
Figure 14:
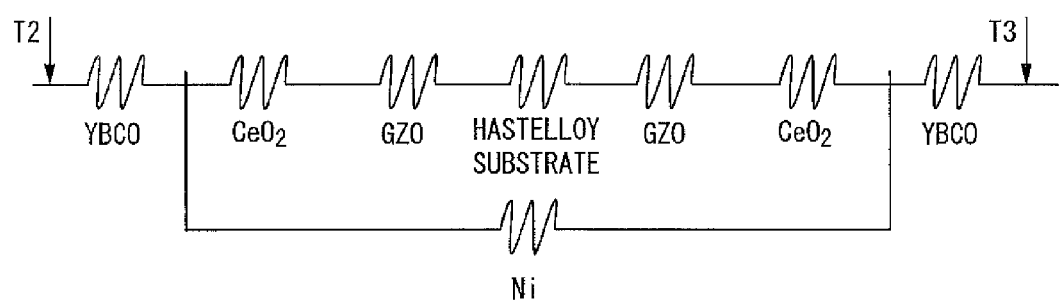
FIG. 14 is an equivalent circuit schematic of the oxide superconductor with the structure shown in FIG. 13.

The transverse resistance values before and after the oxidation treatment were measured by attaching terminals T1, T2, T3, and T4 to the positions previously described based on FIG. 11 to each sample before the oxidation treatment and to each sample after the oxidation treatment. The result is shown in FIG. 8. In FIG. 8, the samples indicated as 25° and the samples indicated as 35° are corresponding to them.

For the purpose of comparison, such samples were prepared that dividing grooves were formed by irradiating a laser vertically downward under the same conditions described above while holding the oxide superconductor horizontal. With regard to these samples, transverse resistance values before the oxidation treatment and after the oxidation treatment were measured in the same way as well. In FIG. 8, the plots of the □ mark indicated 0° and the plots of the o marks indicated 0° are corresponding to the comparison samples.

The values of the test results shown in FIG. 8 are listed in the below table.

TABLE 1

| Angle of incidence (°) | Resistance value (Ω) (before heat treatment) | Resistance value (Ω) (after heat treatment) |
|---|---|---|
| 0 | 0.01> | 0.01> |
| 0 | 0.01> | 0.01> |
| 25 | 0.01> | 25 |
| 25 | 0.01> | 66 |
| 35 | 0.01> | 112 |
| 35 | 0.01> | 210 |

As is clear from the test result shown in FIG. 8, with respect to all the samples indicated as 25° and indicated as 35°, transverse resistance values rose by nearly 100 to 1000 times after the heat treatment. In contrast, with respect to the samples indicated as 0°, there is almost no change in transverse resistance values after the heat treatment.

from the test result, it is proved that the oxide superconductors employing the structure of the present invention, which is obtained by executing the method according to the present invention, separates the filament conductors by high-resistance oxide.

As the high-resistance oxide obtained in the present invention is from 25 to 210Ω as shown Table 1 in this embodiment, and as oxide of 6.2Ω. which is less than 10Ω, was obtained in the examples shown in FIG. 8, high-resistance defines resistance values of 5 to 210Ω or higher.

COMPARISON EXAMPLES

In addition to the aforementioned formation of dividing grooves by laser, a method, in which dividing grooves are formed by performing wet etching treatment in order not to produce molten coagulation, is taken and resistance values are measured as a case in which ideal structure is obtained. An Oxide superconductor of 3 cm long and 1 cm wide which comprises the same laminated structure prepared for the aforementioned embodiment (HASTELLOY substrate+$Gd_2Zr_2O_7$ layer of 0.7 μm thickness+$CeO_2$ layer of 0.3 μm thickness+oxide superconducting layer of $YBa_2Cu_3O_{7-X}$ of 2.4 μm+Ag stabilizing layer of 20 μm thickness) is used.

Relative to the oxide superconductors of this laminated structure, dividing grooves (2 mm wide), which reaches to the bottom of the oxide superconducting layer, are formed by wet etching treatment using a resist of kapton tape, a liquid mixture of hydrogen peroxide solution and ammonia, and an etching liquid of 1 mol of nitric acid. At the same time of this etching treatment, two conductors of thin rectangular shape, which is 2.5 mm wide and 1.5 cm long, which are in parallel with each other are simultaneously formed by means of the same etching treatment. The two parallel conductors comprise an Ag stabilizing layer and an underlying oxide superconducting layer, where the bottom part thereof was bridged via the upper intermediate layer.

When the transverse resistance between the aforementioned two parallel conductors was measured by the four probe method, it was approximately 1000Ω (room temperature).

From the foregoing result, a transverse resistance value of approximately 1000Ω is obtained if oxide of molten coagulation by the laser does not exist inside the dividing groove completely, but that level was not obtained in the aforementioned test cases when fusion cutting was performed by laser. However, if selection of the material for the substrate as well as laser scribing conditions, heat treatment conditions and the like are optimized, it would seem possible to obtain higher resistance than in the aforementioned etching test case. As the oxide superconductors are used in an elongated state for normal conductor use, when etching treatment is performed over the entire length of the elongate oxide superconductor, the fabricating process becomes extremely complicated, and management of the resist liquid and etching liquid, management of the exposure process of the resist, equipment costs and fabricating costs increase dramatically, rendering application of the etching treatment to the oxide superconductors infeasible. In contrast, if such an embodiment that dividing grooves are formed using a laser is taken, it is possible to be applied to any elongated oxide superconductor by performing a process which irradiates laser while moving the oxide superconductor, which enables to obtain high resistance which is 100 times more than the state before the oxidation treatment, although it is inferior to the aforementioned etching treatment. Consequently, it is possible to consider it as a method and a structure which is completely valuable for practical use.

Here, the resistivity of HASTELLOY is $1.3 \times 10^{-6}$ Ωcm at room temperature, the resistivity of Ni is $6.8 \times 10^{-8}$ Ωcm at room temperature, the resistivity of Cr is $1.29 \times 10^{-7}$ Ωcm at room temperature, and the resistivity of Mo is $5.2 \times 10^{-8}$ Ωcm at room temperature. In contrast, the resistivity of NiO is $10^{11}$ Ωcm at room temperature, the resistivity of $Cr_2O_3$ is $10^3$ Ωcm at room temperature, and the resistivity of $MoO_2$ is $2 \times 10^{-6}$ Ωcm at room temperature. Consequently, the creation of higher resistance by the oxidation treatment of the present invention is obvious from a comparison of these characteristic values, and by further devising conditions or the like of fusion cutting by laser and oxidation treatment, it is possible to create even higher resistance than the resistance values exhibited by the samples of the comparison examples, which are performed by aforementioned etching treatment.

The below Table 2 shows a comparative evaluation of the method of the present invention, the conventional method of dividing groove formation by laser fusion cutting, the method of etching treatment, and the method of dividing groove formation by cutter.

TABLE 2

| After-treatment technique | Resistance value between filament conductors | Fabricating speed | Cost | Compatibility elongation | Physical damage |
|---|---|---|---|---|---|
| Present invention | ○ | ◎ | ◎ | ◎ | ◎ |
| Conventional laser | X | ◎ | ◎ | ◎ | ◎ |
| Etching | ◎ | Δ | X | Δ | ◎ |
| Cutter | Δ | ◎ | ◎ | — | X |

("—" indicates that there is a risk of uneven cutting)

From the comparisons in Table 2, the method of the present invention can be judged to be a superior method in comparison to any of the other techniques.

[Laser Spot Diameter Adjustment Test]

Keeping the same conditions as the foregoing embodiment, except that the laser spot diameter is changed, and further dividing grooves are formed on the oxide superconductor to divide the oxide superconducting layer, tests are performed to measure transverse resistance values. Heat treatment is performed at 700° C. for 10 hours in an oxygen atmosphere. The result is shown in FIG. 15.

Figure 15:
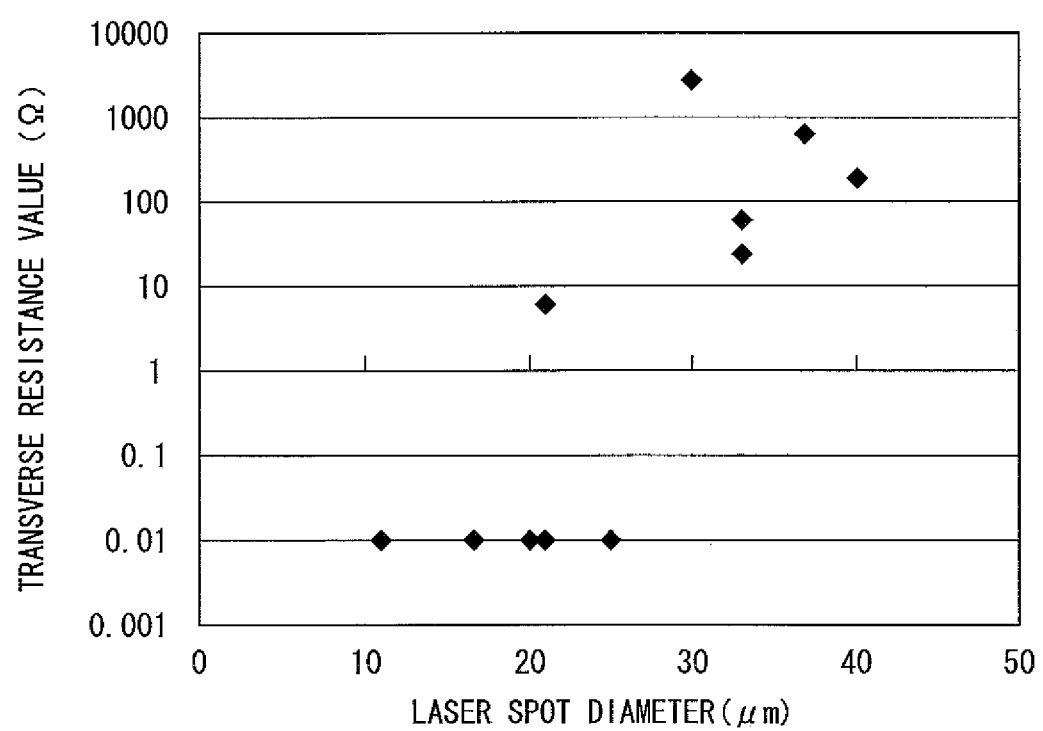
FIG. 15 is a figure showing a relation between laser spot diameter and transverse resistance values.

From the result shown in FIG. 15, some samples are found whose transverse resistance values do not improve even after the heat treatment when the laser spot diameter is 10 to 20 μm range, but a rise in transverse resistance values are found from a range where the laser spot diameter exceeds 20 μm. All samples whose laser spot diameters are 30 μm or more exhibit high transverse resistance values.

Considering the test result, it is desirable to set the laser spot diameter 30 μm or more when making the oxide superconductor of the aforementioned structure a divided structure.

What is claimed is:

1. A low AC loss oxide superconductor comprising an oxide superconducting layer on a base material, wherein
said oxide superconducting layer is separated into a plurality of filament conductors in parallel to the lengthwise direction of said base material by dividing grooves which are plurally formed in the widthwise direction of said base material, wherein
a high-resistance oxide having an electrical resistivity of 44 Ωcm or more is formed in said dividing grooves,
electrical resistance between adjacent filament conductors via said dividing grooves increases due to said high-resistance oxide formed in said dividing grooves and low AC loss is realized,
said high-resistance oxide is an oxide of molten coagulation which adhered to the inside of said dividing grooves, and
the diving grooves are arranged at an angle greater than or equal to 25° and less than or equal to 45° relative to the normal line of the base material when viewed from front.

2. The low AC loss oxide superconductor according to claim 1, wherein the high-resistance oxide formed in said dividing grooves has an electrical resistivity of 44 Ωcm or more and 369 Ωcm or less.

3. The low AC loss oxide superconductor according to claim 2, wherein said dividing grooves are formed to a depth that reaches said base material.

4. The low AC loss oxide superconductor according to claim 2, wherein said base material comprises an intermediate layer for crystal orientation control or diffusion prevention formed on a metallic substrate.

5. The low AC loss oxide superconductor according to claim 2, wherein said high-resistance oxide contains NiO or $Cr_2O_3$.

6. The low AC loss oxide superconductor according to claim 2, wherein an oxide superconductor comprises:
an oxide superconducting layer formed on a base material; and a stabilizing layer composed of conductive metallic material formed on said oxide superconducting layer, wherein said dividing grooves are formed so as to reach from said stabilizing layer to said base material.

7. The low AC loss oxide superconductor according to claim 2, wherein the oxide superconductor comprises:
   the base material comprising:
      a substrate made of a heat resistant Ni alloy;
      a lower intermediate layer of $Gd_2Zr_2O_7$ formed on the substrate; and
      an upper intermediate layer of $CeO_2$,
   a superconducting layer of rare-earth oxide formed on said upper intermediate layer; and
   a stabilizing layer of conductive metal material formed on the superconducting layer, wherein said dividing grooves are formed so as to reach from said stabilizing layer to said base material.

* * * * *